United States Patent
Jeon et al.

(10) Patent No.: US 7,895,499 B2
(45) Date of Patent: Feb. 22, 2011

(54) METHOD AND APPARATUS FOR CHECKING PIPELINED PARALLEL CYCLIC REDUNDANCY

(75) Inventors: Ki-Man Jeon, Sungnam (KR); Chang-Won Park, Suwon (KR); Young-Hwan Kim, Sungnam (KR); Ki-Tae Kim, Ansan (KR); Hyun-bean Yi, Ansan (KR); Sung-Ju Park, Ansan (KR)

(73) Assignee: Korea Electronics Technology Institute, Kyunggi-do (KR)

( * ) Notice: Subject to any disclaimer, the term of this patent is extended or adjusted under 35 U.S.C. 154(b) by 1041 days.

(21) Appl. No.: 11/616,480

(22) Filed: Dec. 27, 2006

(65) Prior Publication Data

US 2007/0234177 A1     Oct. 4, 2007

(30) Foreign Application Priority Data

Dec. 29, 2005     (KR) ...................... 10-2005-0133449

(51) Int. Cl.
*H03M 13/00*     (2006.01)
(52) U.S. Cl. ...................... 714/757; 714/781
(58) Field of Classification Search ................. 714/757, 714/781
See application file for complete search history.

(56) References Cited

U.S. PATENT DOCUMENTS

| | | | | | |
|---|---|---|---|---|---|
| 3,534,331 | A | * | 10/1970 | Kautz | 714/757 |
| 3,678,469 | A | * | 7/1972 | Freeman et al. | 714/779 |
| 4,720,830 | A | * | 1/1988 | Joshi et al. | 714/775 |
| 4,720,831 | A | * | 1/1988 | Joshi et al. | 714/781 |
| 4,723,243 | A | * | 2/1988 | Joshi et al. | 714/776 |
| 5,367,479 | A | * | 11/1994 | Van Der Putten | 708/650 |
| 6,725,415 | B2 | * | 4/2004 | Ishiwaki | 714/781 |
| 7,398,449 | B1 | * | 7/2008 | Normoyle et al. | 714/767 |

* cited by examiner

*Primary Examiner*—Joseph D Torres
(74) *Attorney, Agent, or Firm*—Sughrue Mion, PLLC

(57) ABSTRACT

A method and an apparatus for checking a pipelined parallel cyclic redundancy is disclosed. In accordance with the method and the apparatus of the present invention, after an entire CRC (cyclic redundancy check) logic is divided into a feedback portion and an input data portion, the input data portion is divided using a pipelined structure such that the input data portion is designed to have the pipelined structure based on an algorithm that maintains a logic level of each stage to be lower than that of the feedback portion and an algorithm that optimizes a size of a register inserted during the division to improve a speed thereof and to detect an error of a received data in a high speed data communication apparatus.

6 Claims, 3 Drawing Sheets

[Fig. 1]
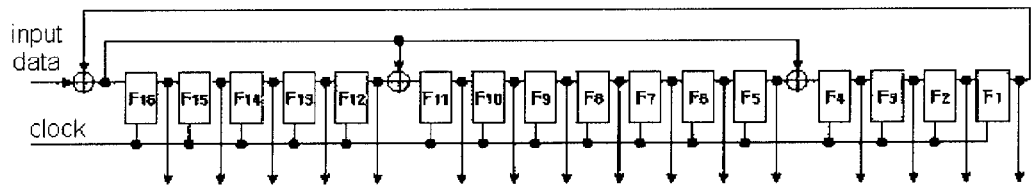
[Fig. 2]
Definitions :
n : size of data and register
D : input data
C : initilal value of register
X : D XOR C
P : n-bit variable representing a position requring XOR
　　tab as "1" and a position not requring XOR tab as
　　　　"0" in LFSR embodied by polynomial
F : value stored in register
CRC Gen. :
```
for (i = 1; i = n; i++)
{
    X[i] = D[i] ^ C[i];
    for (j = 1; j = n; j++)
    {
        if (P[j] == 1)
            F[j] = X[i] ^ F[j+1];
        Else
            F[j] = F[j+1];
    }
}
```

[Fig. 3]
| F1 | X4 X5 X8 X12 X16 |
|---|---|
| F2 | X3 X4 X7 X11 X15 |
| F3 | X2 X3 X6 X10 X14 |
| F4 | X1 X2 X5 X9 X13 |
| F5 | X1 X4 X8 X12 |
| F6 | X3 X4 X5 X7 X8 X11 X12 X16 |
| F7 | X2 X3 X4 X6 X7 X10 X11 X15 |
| F8 | X1 X2 X3 X5 X6 X9 X10 X14 |
| F9 | X1 X2 X4 X5 X8 X9 X13 |
| F10 | X1 X3 X4 X7 X8 X12 |
| F11 | X2 X3 X6 X7 X11 |
| F12 | X1 X2 X5 X6 X10 |
| F13 | X1 X8 X9 X12 X16 |
| F14 | X7 X8 X11 X15 |
| F15 | X6 X7 X10 X14 |
| F16 | X5 X6 X9 X13 |
[Fig. 4]
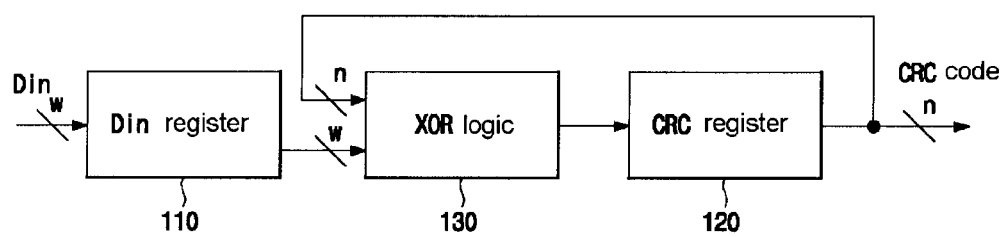

[Fig. 5]
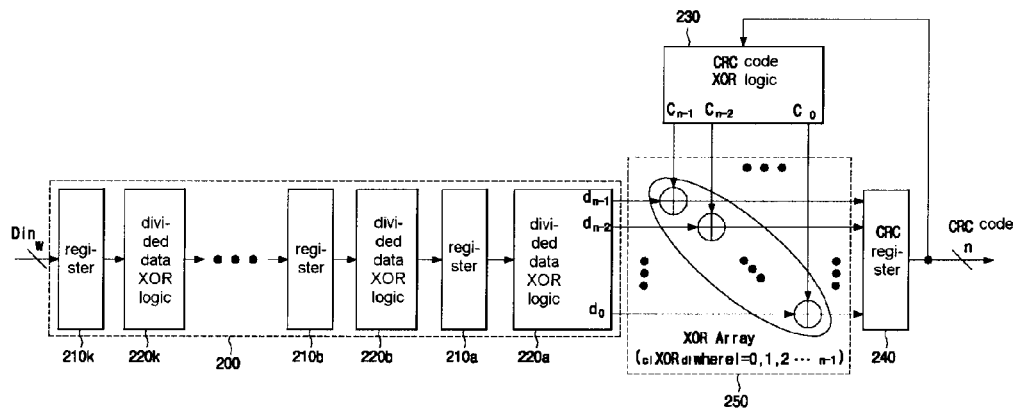
[Fig. 6]
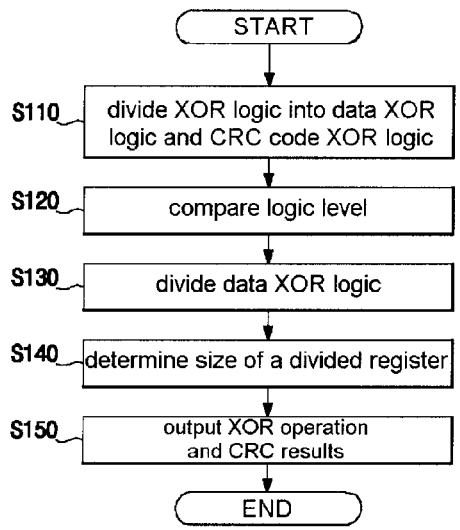

METHOD AND APPARATUS FOR CHECKING PIPELINED PARALLEL CYCLIC REDUNDANCY

RELATED APPLICATIONS

The present disclosure relates to subject matter contained in priority Korean Application No. 10-2005-0133449, filed on 29 Dec. 2005 which is herein expressly incorporated by reference in its entirety.

BACKGROUND OF THE INVENTION

1. Field of the Invention

The present invention relates to a method and an apparatus for checking a pipelined parallel cyclic redundancy, and in particular, to a method and an apparatus for checking a pipelined parallel cyclic redundancy wherein, after an entire CRC (cyclic redundancy check) logic is divided into a feedback portion and an input data portion, the input data portion is divided using a pipelined structure such that the input data portion is designed to have the pipelined structure based on an algorithm that maintains a logic level of each stage to be lower than that of the feedback portion and an algorithm that optimizes a size of a register inserted during the division to improve a speed thereof and to detect an error of a received data in a high speed data communication apparatus.

2. Description of Prior Art

The CRC is a most widely used method for detecting an error in a data communication system. For instance, Korean Patent No. 126591, titled "PARALLEL CIRCULATION REDUNDANCY MONITORING CODE GENERATION MEANS FOR HIGH TRANSPORT PROTOCOL CHECK CODE GENERATION" filed by Electronics and Telecommunications Research Institute on Dec. 13, 1994 and registered on Oct. 16, 1997 discloses a means for generating a CRC data in detail.

Specifically, a transmitter and a receiver uses a predetermined number as a divisor to divide a data to be transmitted by the transmitter by the predetermined number. A remainder is then attached to the data to be transmitted. The receiver compares a remainder by dividing a received data by the predetermined number, or checks whether the remainder is zero by dividing a received data including the remainder by the predetermined number to check an error of the data. During the process, the remainder itself is the CRC code, and the CRC code is always smaller than the predetermined number since the CRC code is the remainder obtained by the division by the predetermined number.

Based on this principle, a current data communication system employs a few polynomials standardized as the divisor, and a result obtained by carrying out an operation with a binary module is used as the CRC code.

Therefore, in a serial data communication system, since an XOR gate may be used to carry out the operation, a LFSR (Linear Feedback Shift Register) and the XOR gate may be used for a realization.

FIG. 1 is a diagram illustrating an example of a conventional CRC generator. The conventional CRC generator of FIG. 1 employs the LFSR for a polynomial $P(x)=x^{16}+x^{12}+x^5+1$ (compliant to ITU_TSS standard).

As shown, the CRC corresponding to the polynomial $P(x)=x^{16}+x^{12}+x^5+1$ is generated by adding a data value shifted by a plurality of LFSRs F1 through F16.

As shown in FIG. 1, the serial CRC generation obstructs an improvement of a system speed. Therefore, a research on a method wherein the CRC code is generated in one clock cycle after a serial data is converted to a parallel data has be conducted. As a result, a CRC generation circuit wherein the parallel data is inputted and the CRC data is generated in one cycle through a XOR combination circuit has been developed instead of the conventional serial CRC generation wherein the CRC data is stored in each flip-flop after a plurality of shifts and an XOR operation.

FIG. 2 is a diagram illustrating a pseudo code of a conventional CRC generation algorithm for obtaining a combination of Xi that generates a result of each registers after n number of shifts. The result stored in each F for every loop is represented as Xi instead of a calculated number to obtain the combination of Xi as shown in FIG. 3. Referring to FIG. 2, an embodiment of a basic parallel CRC circuit may be generalized as follows.

In order to describe an algorithm for embodying n-bit CRC generator wherein a size of the parallel data and a length of a CRC register are a positive integer n, it is assumed that I is a positive integer equal to or smaller than n (i=1, 2, . . . , n) for a n-bit LFSR, Fi is an i-th register of the LFSR, Ci is an initial value stored in Fi prior to a shift, Di is an i-th input data, a data is inputted from a least significant bit D1, and the shift progresses to a direction of low number register as shown in FIG. 1.

The initial value Ci of the register prior to the shift differs according to the CRC generation method. The initial value Ci may be set as '1', '0' or alternating '1' and '0'.

In accordance with the CRC generation, one bit is shifted for each clock to store a new value consisting of a combination of each of Ci and Di by the shift and the XOR gate in the register Fi.

For instance, after one shift in FIG. 1, F16 stores (D1 XOR C1), F11 stores (D1 XOR C1 XOR C12), F4 stores (D1 XOR C1 XOR C5), and other registers simply stores Fi+1. In a similar manner, values stored in each of the registers after n number of shifts are the CRC code for the n-bit data. In addition, if Xi is (Di XOR Ci), the values stored in the registers after the n number of shifts only include a combination of Xi. Therefore, one Xi is two XOR gate and the parallel CRC circuit for generating the CRC code in one clock from the combination of Xi may be embodied.

FIG. 3 is a diagram illustrating a CRC result having the pseudo code applied thereto. In FIG. 3, a result wherein the pseudo code of FIG. 2 is applied to the polynomial $P(x)=x^{16}+x^{12}+x^5+1$ (compliant to ITU_TSS standard). An operation value of X4 XOR X5 XOR X8 XOR X12 XOR X16 is stored in F1, and an operation value of X5 XOR X6 XOR X9 XOR X13 is stored in F16.

On the other hand, while FIGS. 2 and 3 illustrates a case wherein the size of the parallel data and the length of the CRC register is the positive integer n, a general case wherein the size of the parallel data is w and the length of the CRC register is the positive integer n may be embodied by Equation 1.

$$F = \begin{bmatrix} p_{n-1} & 1 & 0 & \cdots & 0 \\ p_{n-2} & 0 & 1 & \cdots & 0 \\ \cdots & \cdots & \cdots & \cdots & \cdots \\ p_1 & 0 & 0 & \cdots & 1 \\ p_0 & 0 & 0 & \cdots & 0 \end{bmatrix} \quad \text{[Equation 1]}$$

Using the conversion matrix F, the CRC may be expressed as Equation 2 where the parallel data D is $D=[d_{w-1}, d_{w-2}, \ldots d_0|0, \ldots, 0]^T$ when w<n, $D=[d_{w-1}, d_{w-2}, \ldots d_0]^T$ when w=n, and the CRC code C is $C=[c_{n-1}, c_{n-2}, \ldots c_0]^T$.

$$CRC = F^w(C \oplus D) \quad \text{[Equation 2]}$$

is an operator denoting a matrix multiplication and ⊕ is an operator denoting an XOR operation of the matrix.

A detailed description of the method is disclosed in a paper by G. Campobello, G. Patane and M. Russo, titled "Parallel CRC Realization," IEEE Transactions on Computers, Vol. 52, pp. 63-71, October, 2003.

FIG. 4 is a diagram illustrating an example of a conventional CRC generation circuit.

The conventional CRC generation circuit of FIG. 4 is embodies based on Equation 1, and a basic parallel CRC circuit using a Din register 110 of w bits, a CRC register 120 of n bits and a CRC result table is shown.

That is, an input data is Din of w bits, and the input data is stored in the Din register 110. In addition, a CRC_Code of n bits is outputted by the CRC register 120 of n bits for storing the CRC result table, an XOR logic 130 for carrying out an XOR operation based on the CRC table of n bits and Din of w bits.

Examples of the conventional CRC circuit may be referred from papers below.

A paper by D. V. Sarwate, titled "Computation of Cyclic Redundancy Checks via Table Look-Up," Comm. ACM, August, 1988, a paper by S. M. Joshi, P. K. Dubey and M. A. Kaplan, titled "A New Parallel Algorithm for CRC Generation," IEEE International Conference on Communications, Vol. 3, pp. 18-22, Jun. 2000 disclose the generation of the CRC using a table search method. However, it is disadvantageous in that a time required for searching the table is increased as an order and a data width of a code generation polynomial are increased.

In addition, a paper by T. B. Pei and C. Zukowski, titles "High-Speed Parallel CRC Circuits in VLSI", IEEE Transaction on Communications, Vol. 40, no. 4, pp. 653-657, 1992 discloses a 32-bit CRC circuit having a input data width of 8 bits using a result after eight shifts of a 32-bit LFSR.

A paper by R. F. Hobson and K. L. Cheng, titled "A High-Performance CMOS 32-Bit Parallel CRC Engine," IEEE Journal of Solid-State Circuits, Vol. 34, No. 2, pp. 233-235, February, 1999 discloses a mapping technology wherein a data width is expanded to 32 bits, a logic stage is minimized using a pre-decoding logic and a binary tree reduction scheme, and an XOR gate having a reduced fan-out is used in order to improve a speed.

A paper by M. D. Shieh et al., titled "A Systematic Approach for Parallel CRC Computations", J. Information Science and Engineering, May, 2001 discloses a parallel CRC circuit based on Galois Field theory, and a paper by M. Spachmann, titled "Automatic Generation of Parallel CRC Circuits", IEEE Design and Test of Computers, Vol. 18, pp. 108-114, May, 2001 discloses a VHDL code applicable to various generation polynomials and data widths.

The paper by G. Campobello, G. Patane and M. Russo, titled "Parallel CRC Realization," IEEE Transactions on Computers, Vol. 52, pp. 63-71, October, 2003 discloses an optimized equation applicable to a case wherein the data width is equal to or lower than the order of the generation polynomial by improving the circuit disclosed in the paper by M. D. Shieh et al., which provides a high performance compared to the CRC circuit disclosed in the conventional papers.

However, the conventional parallel CRC circuit is difficult to be applied to a high speed data communication since a scheme for preventing a redundancy of the circuit or reducing a logic level for using a high clock frequency is not tried.

Therefore, a method for embodying an optimized CRC circuit that is applicable to every CRC circuit is needed.

SUMMARY OF THE INVENTION

It is an object of the present invention to provide an apparatus for checking a pipelined parallel cyclic redundancy wherein, after an entire CRC (cyclic redundancy check) logic is divided into a feedback portion and an input data portion, the input data portion is divided using a pipelined structure such that the input data portion is designed to have the pipelined structure based on an algorithm that maintains a logic level of each stage to be lower than that of the feedback portion and an algorithm that optimizes a size of a register inserted during the division to improve a speed thereof and to detect an error of a received data in a high speed data communication apparatus.

It is an object of the present invention to provide a method for checking a pipelined parallel cyclic redundancy wherein, after an entire CRC (cyclic redundancy check) logic is divided into a feedback portion and an input data portion, the input data portion is divided using a pipelined structure such that the input data portion is designed to have the pipelined structure based on an algorithm that maintains a logic level of each stage to be lower than that of the feedback portion and an algorithm that optimizes a size of a register inserted during the division to improve a speed thereof and to detect an error of a received data in a high speed data communication apparatus.

It is an object of the present invention to provide an apparatus for checking a pipelined parallel cyclic redundancy, comprising: a data XOR logic for receiving a parallel data of w bits; a CRC code XOR logic for receiving a CRC code of n bits; an XOR array for carrying out an XOR operation of an output of the data XOR logic and an output of the CRC code XOR logic to output a CRC code result of n bits; and a CRC register for feeding back the CRC code of n bits currently stored therein to the CRC code XOR logic and for storing the CRC code result of n bits therein being outputted from the XOR array as a new CRC code of n bits, where w is a natural number and n is a natural number smaller than w.

In order to achieve the above-described object, there is provided a method for checking a pipelined parallel cyclic redundancy, comprising steps of: dividing a XOR logic for a CRC calculation into a data XOR logic for receiving a parallel data of w bits and a CRC code XOR logic for receiving a CRC code of n bits; comparing a logic level of the data XOR logic and a logic level of the CRC code XOR logic to divide the data XOR logic into a plurality of divided XOR logics when the logic level of the data XOR logic is larger than that of the CRC code XOR logic in case of w>n; determining a size of a divided register corresponding to the plurality of divided XOR logics; and carrying out an XOR operation of a final output of the plurality of divided XOR logics and a final output of the CRC code XOR logic to output a CRC code result of n bits (where w and n are natural numbers).

BRIEF DESCRIPTION OF THE DRAWINGS

FIG. 1 is a diagram illustrating an example of a conventional CRC generator.

FIG. 2 is a diagram illustrating a pseudo code of a conventional CRC generation algorithm.

FIG. 3 is a diagram illustrating a CRC result having the pseudo code applied thereto.

FIG. 4 is a diagram illustrating an example of a conventional CRC generation circuit.

FIG. 5 is a diagram illustrating an apparatus for checking a pipelined parallel cyclic redundancy in accordance with the present invention.

FIG. 6 is a flow diagram illustrating a method for checking a pipelined parallel cyclic redundancy in accordance with the present invention.

DETAILED DESCRIPTION OF THE INVENTION

The above-described objects and other objects and characteristics and advantages of the present invention will now be described in detail with reference to the accompanied drawings.

FIG. 5 is a diagram illustrating an apparatus for checking a pipelined parallel cyclic redundancy in accordance with the present invention.

As shown, the apparatus for checking the pipelined parallel cyclic redundancy in accordance with the present invention comprises a data XOR logic 200 including registers 210a through 210k and divided data XOR logic 220a through 220k, a CRC code XOR logic 230, a CRC register 240 and a XOR array 250.

A logic level of a critical path of an XOR logic 130 of FIG. 4 is determined by a CRC when an input data bits w are equal to or smaller than a feedback CRC result bits n. However, when w is larger than n, the logic level of the critical path of the XOR logic 130 is determined by the input data since a magnitude of the input data is larger than that of the CRC.

Therefore, in accordance with the apparatus for checking the pipelined parallel cyclic redundancy of the present invention, for a CRC circuit of n bits, the XOR logic 130 of FIG. 4 is divided into a logic having a feedback CRC_code as an input and a logic having a parallel data Din as an input when w is larger than n, and a pipeline is configured such that a logic level of each stage of the logic having the parallel data Din as the input is equal to or smaller than a maximum logic value of the logic having the feedback CRC_code as the input to improve a performance thereof.

Each output of the XOR logic 130 of FIG. 4 includes an XOR of an entire or a portion of the CRC_code of n bits and an entire or a portion of the Din of w bits. Therefore, as shown in FIG. 5, the XOR logic 130 may be divided into the CRC code XOR logic 230, the divided data XOR logic 220a through 220k and the XOR array 250.

The CRC code XOR logic 230 is difficult to be embodied as the pipeline since a value that is updated every clock is feedback thereto. Therefore, the data XOR logic 220 is divided into a plurality of stages of the pipeline while maintaining a logic level of the divided data XOR logic 220a through 220k is smaller than that of the CRC code XOR logic 230 such that a clock of a high frequency may be used even when a size of w is increased.

Assuming that CX and DX denotes the two divided logic, i.e. the CRC code XOR logic 230 and the data XOR logic 220, and Equation 2 is extended to w>n, an Equation for embodying the CRC code XOR logic 230 and the divided data XOR logic 220a through 220k may be derived.

Firstly, for integer i=0, 1, ..., n-1, the parallel input data Din, a result Cr of the CX, a result Dr of the DX, a result CRC_Code of the CRC may be expressed as Equation 3.

$$Din=[din_{w-1}, din_{w-2}, \ldots din_0]^T$$

$$Cr=[C_{n-1}, c_{n-2}, \ldots c_0]^T$$

$$Dr=[d_{n-1}, d_{n-2}, \ldots d_0]^T$$

$$CRC\_Code=[crc_{n-1}, crc_{n-2}, \ldots crc_0]^T \qquad \text{[Equation 3]}$$

In this case, $crc_i(t+1)=c_i(t) \oplus XOR\ d_i(t)$ is satisfied. That is, since CRC_Code(t+1) which is to be stored in the CRC register 240 in a next state is generated by XOR of Cr(t) and Dr(t), Equation 4 is obtained.

$$CRC\_Code(t+1)=Cr(t) \oplus Dr(t) \qquad \text{[Equation 4]}$$

Since CX corresponds to a case wherein every element of Din is zero, every element of Dr is also 0. Therefore, Cr(t) may be expressed as Equation 5 by Equations 2 and 4.

$$Cr(t)=F^n CRC\_Code(t), \text{ where } CRC\_Code(t+1)=Cr(t) \qquad \text{[Equation 5]}$$

Since w≧n in case of DX, the input data of w bits may be required to be grouped by a unit of n bits in order to be applicable to Equation 5 based on Equation 2. That is, when w=n×k is satisfied (where k is a positive integer), Din is divided into k number of groups having a number of elements of n bits as expressed in Equation 6.

$$Din^1 = [din_{w-1}, din_{w-2}, \ldots, din_{w-n}]^T \qquad \text{[Equation 6]}$$
$$Din^2 = [din_{w-n-1}, din_{w-n-2}, \ldots, din_{w-2n}]^T$$
$$\vdots \qquad \vdots$$
$$Din^k = [din_{w-(k-1)n-1}, din_{w-(k-1)n-2}, \ldots, din_0]^T$$

When w is not divisible by n, that is, w=n×(k-1)+j is satisfied (where j is a positive integer equal to or less than n), j number of zeros are added to $Din^k$ to form $Din^k$ as a group of n bits as expressed in Equation 7.

$$Din^k=[din_{w-(k-1)n-1}, din_{w-(k-1)n-2}, \ldots, din_0, 0, \ldots, 0]^T \qquad \text{[Equation 7]}$$

In order to embody DX using the divided input data groups, a principle that a result stored in a LFSR is used as an initial value for a next input data after each cycle when a data is shift-inputted to the LFSR.

It is assumed that a variable stored in the LFSR is defined as $V=[v_{n-1}, v_{n-2}, \ldots v_0]^T$, and $D'in^k$ is defined as $D'in^k=F^n(V \oplus Din^k)$. Since Cr=0 in DX, an initial value is $V=[0, \ldots, 0]^T$, and $V=D'in^1$ for $Din^2$. Therefore, $V=D'in^{k-1}$ for $Din^k$. When these procedures are applied to Equation 2, Equation 8 is obtained.

$$D'in^1 = F^n \otimes ([0, \ldots, 0]^T \oplus Din^1) = F^n \otimes Din^1 \qquad \text{[Equation 8]}$$
$$D'in^2 = F^n \otimes (D'in^1 \oplus Din^2)$$
$$\vdots \qquad \vdots$$
$$D'in^k = F^n \otimes (D'in^{k-1} \oplus Din^k)$$

Here, $Din^k$ finally obtained is Dr(t). That is, Dr(t) may be expressed as Equation 9.

$$Dr(t)=F^n(F^n \ldots (F^n((F^n \otimes Din^1(t)) \oplus Din^2(t))) \ldots \oplus Din^k(t)) \qquad \text{[Equation 9]}$$

When the data XOR logic is divided using Equation 9, the data XOR logic may be embodied by a series of the registers 210a through 210k and the divided data XOR logic 220a through 220k as shown in FIG. 5.

A key point of the present invention lies in that how a size of the registers 210a through 210k and the level of the divided data XOR logic 220a through 220k are determined in embodying the apparatus for checking the pipelined parallel cyclic redundancy in accordance with the present invention. In this case, analyzing a connection information of each logic gate, i.e. a net list and inserting the registers in a proper position may be considered. However, when a circuit becomes large and complex, the analysis is very difficult without a systematic method.

Therefore, a simple method described below may be employed.

The logic levels of CX and DX of the CRC circuit to be embodied should be analyzed to determine whether the DX requires the division.

Table 1 shows the number of the input N and the logic level L constituting the critical paths of CX and DX for each of three 16 bit CRCs and one 32 bit CRC when an input data width w is 32, 64, 128 and 256 bits.

TABLE 1

| CRC type generated polynomial | CRC16-A (ITU-TSS) $1 + x^5 + x^{12} + x^{16}$ | | | | CRC16-B (HDLC) $1 + x^2 + x^{15} + x^{16}$ | | | | CRC16-C (PCI-Express, InfiniBand, etc.) $1 + x + x^3 + x^{12} + x^{16}$ | | | | CRC32 (Ethernet, ATM, PCI-Express, InfiniBand, etc.) $1 + x + x^2 + x^4 + x^5 + x^7 + x^8 + x^{10} + x^{11} + x^{12} + x^{16} + x^{22} + x^{23} + x^{26} + x^{32}$ | | | |
|---|---|---|---|---|---|---|---|---|---|---|---|---|---|---|---|---|
| XOR logic | CX | | DX | | CX | | DX | | CX | | DX | | CX | | DX | |
| calculation | N | L | N | L | N | L | N | L | N | L | N | L | N | L | N | L |
| w (bit) 32 | 11 | 4 | 18 | 5 | 14 | 4 | 29 | 5 | 15 | 4 | 24 | 5 | 17 | 5 | 17 | 5 |
| 64 | 12 | 4 | 25 | 5 | 12 | 4 | 56 | 6 | 12 | 4 | 47 | 6 | 19 | 5 | 34 | 6 |
| 128 | 9 | 4 | 70 | 7 | 8 | 3 | 100 | 7 | 10 | 4 | 77 | 7 | 20 | 5 | 69 | 7 |
| 256 | 10 | 4 | 132 | 8 | 13 | 4 | 175 | 8 | 10 | 4 | 146 | 8 | 20 | 5 | 138 | 8 |

ITU-TSS represents International Telecommunications Union—Telecommunication Standardization Sector, HDLC represents High-Level Data Link Control, CX represents the CRC code XOR logic, DX represents the Data XOR logic, N represents the number of input bits that affects the critical path, L represents the logic level of the critical path, and w refers to a width of the parallel input data.

When an entire logic is assumed to be synthesized as a complete binary tree, L may be calculated from Equation 10.

$L = \lceil \log_2 N \rceil$ (where operator $\lceil \ \rceil$ is a round-up to nearest integer operator) [Equation 10]

Let's assume that each level is properly divided from an analysis result of the logic level with reference to table 1, and that i is defined as i=0, 1, ..., k−1 and the logic level of each logic is defined as DL(0), DL(1), ... DL(k−1).

Since DL(i) is a result of the division of the logic level of the critical path of the DX, the size of the register required for the input/output of each logic may be determined with respect to one output, and the same may be applied to a rest of the outputs.

Of the output Dr, w is assumed as the output of the critical path, and wc(i) is assumed as the number of inputs of the inputs of the DX(i) affecting the dc. wc(k−1) is the number of inputs of the inputs of Din affecting the dc, and is given by table 2.

For instance, when CRC16-A, w=32, wc(k−1) is 18. Of the wc(i), when wdc(i) is assumed to be the number of inputs affecting the critical path of DX(i), wdc(i) may be given by Equation 11.

$2^{DL(i)-1} + 1 < wdc(i) \leq 2^{DL(i)}$ [Equation 11]

If an input register of each DX is Reg(0), Reg(1), ... Reg(k−1) as shown in FIG. 5, Regdc(i) is assumed as a portion affecting the dc of Reg(i).

DL(i) is the logic level for one register corresponding to the critical path of Regdc(i−1). Therefore, Regdc(i) may be expressed as Equation 12 since wc(k−1) is given by table 2.

$Re\,gdc(i) = wc(i)$ if $i = k-1$ $Re\,gdc(i) = \lceil wc(i+1)/wdc(i+1) \rceil$ otherwise, [Equation 12]

where operator $\lceil \ \rceil$ is a round-up to nearest integer operations.

However, since a range of wdc(i) is same as that of Equation 11, a size of Regdc(i) may be minimized by wdc(i)= $2^{DL(i)}$. The same process may be applied to the rest of the outputs for the determination.

An analysis and comparison of performance by embodying the four types of the CRCs shown in table 1 as a single logic for w=32, 64, 128 and 256 as shown in FIG. 4, and using the pipeline structure is shown in table 2.

TABLE 2

| CRC type structure calculation | CRC16-A | | | CRC16-B | | | CRC16-C | | | CRC32 | | |
|---|---|---|---|---|---|---|---|---|---|---|---|---|
| | conventional | pipelined | | conventional | pipelined | | conventional | pipelined | | conventional | pipelined | |
| | delay (ns) | delay (ns) | decrease (%) | delay (ns) | delay (ns) | decrease (%) | delay (ns) | delay (ns) | decrease (%) | delay (ns) | delay (ns) | decrease (%) |
| w (bit) 32 | 2.70 | 2.28 | 15.56 | 3.22 | 2.28 | 29.19 | 3.23 | 3.03 | 6.19 | 2.90 | 2.88 | 0.69 |
| 64 | 3.06 | 2.34 | 23.53 | 3.32 | 2.43 | 26.81 | 3.05 | 2.25 | 26.23 | 3.24 | 2.55 | 21.30 |
| 128 | 3.39 | 2.31 | 31.86 | 3.47 | 2.38 | 31.41 | 3.50 | 2.45 | 30.00 | 3.68 | 2.91 | 20.92 |
| 256 | 3.84 | 2.18 | 43.23 | 3.99 | 2.63 | 34.09 | 3.92 | 2.18 | 44.39 | 4.28 | 2.94 | 31.31 |

"conventional" refers to the conventional parallel CRC circuit shown in FIG. 4, and "pipelined" refers to the CRC generation circuit of the present invention shown in FIG. 5. "delay" refers to a data arrival time in the critical path, and "decrease" refers to a decrease of the delay in %.

As shown, the data arrival time in the critical path, i.e. the delay is greatly reduced when w is large compared to the conventional circuit.

FIG. 6 is a flow diagram illustrating a method for checking a pipelined parallel cyclic redundancy in accordance with the present invention.

Referring to FIG. 7, the XOR logic for the CRC calculation is divided (S110).

That is, the XOR logic for the CRC calculation is divided into a data XOR logic for receiving a parallel data of w bits (where w is a natural number) and a CRC code XOR logic for receiving a CRC code of n bits (where n is a natural number).

Thereafter, in case of w>n, after comparing a logic level of the data XOR logic and a logic level of the CRC code XOR logic (S120), the data XOR logic is divided into a plurality of divided XOR logics when the logic level of the data XOR logic is larger than that of the CRC code XOR logic(S130).

Next, a size of a divided register corresponding to the plurality of divided XOR logics is determined (S140).

Thereafter, an XOR operation of a final output of the plurality of divided XOR logics and a final output of the CRC code XOR logic is carried out to output a CRC code result (S150).

Since a detailed description of the method for checking a pipelined parallel cyclic redundancy in accordance with the present invention is identical to that of the apparatus for checking a pipelined parallel cyclic redundancy in accordance with the present invention, the detailed description is omitted.

As described above, the pipelined parallel CRC provides improved performance compared to the conventional parallel CRC.

While the present invention has been particularly shown and described with reference to the preferred embodiment thereof, it will be understood by those skilled in the art that various changes in form and details may be effected therein without departing from the spirit and scope of the invention as defined by the appended claims.

As described above, in accordance with the present invention, after the entire CRC (cyclic redundancy check) logic is divided into the feedback portion and the input data portion, the input data portion is divided using the pipelined structure such that the input data portion is designed to have the pipelined structure based on the algorithm that maintains the logic level of each stage to be lower than that of the feedback portion and the algorithm that optimizes a size of a register inserted during the division to improve the speed thereof and to detect the error of the received data in the high speed data communication apparatus.

What is claimed is:

1. An apparatus for checking a pipelined parallel cyclic redundancy, comprising:
   a data XOR logic for receiving a parallel data of w bits;
   a CRC code XOR logic for receiving a CRC code of n bits;
   an XOR array for carrying out an XOR operation of an output of the data XOR logic and an output of the CRC code XOR logic to output a CRC code result of n bits; and
   a CRC register for feeding back the CRC code of n bits currently stored therein to the CRC code XOR logic and for storing the CRC code result of n bits therein being outputted from the XOR array as a new CRC code of n bits, where w is a natural number and n is a natural number smaller than w.

2. The apparatus in accordance with claim 1, wherein the data XOR logic comprises:
   a plurality of divided XOR logics for dividing a logic level of the data XOR logic to be equal to or less than that of the CRC code XOR logic; and
   a plurality of divided register for carrying out a data input/output of each of the plurality of divided XOR logics.

3. The apparatus in accordance with claim 2, wherein the parallel data is expressed as k number of groups having n number of elements $$Din^1 = [din_{w-1}, din_{w-2}, \ldots, din_{w-n}]^T$$
$$Din^2 = [din_{w-n-1}, din_{w-n-2}, \ldots, din_{w-2n}]^T$$
$$\vdots \qquad \vdots$$
$$Din^k = [din_{w-(k-1)n-1}, din_{w-(k-1)n-2}, \ldots, din_0]^T,$$

wherein the k number of groups corresponds to input/output of the plurality of divided XOR logics, and wherein a final output of the plurality of divided XOR logics is expressed as $$Dr(t)=F^n(F^n \ldots (F^n((F^nDin^1(t)) \oplus Din^2(t))) \ldots \oplus Din^k(t)),$$

where the parallel data $Din=[din_{w-1}, din_{w-2}, \ldots din_0]^T$, the CRC code Cr is $Cr=[C_{n-1}, C_{n-2}, \ldots C_0]^T$, the CRC code result $CRC_{13}$ Code of n bits is $CRC^{13}Code =[crc_{n-1}, crc_{n-2}, \ldots crc_0]^T$, $w = n \times k$, k is a positive integer, and $$F = \begin{bmatrix} p_{n-1} & 1 & 0 & \cdots & 0 \\ p_{n-2} & 0 & 1 & \cdots & 0 \\ \cdots & \cdots & \cdots & \cdots & \cdots \\ p_1 & 0 & 0 & \cdots & 1 \\ p_0 & 0 & 0 & \cdots & 0 \end{bmatrix}.$$

4. The apparatus in accordance with claim 2, wherein the parallel data is expressed as k number of groups having n number of elements $$Din^1 = [din_{w-1}, din_{w-2}, \ldots, din_{w-n}]^T$$
$$Din^2 = [din_{w-n-1}, din_{w-n-2}, \ldots, din_{w-2n}]^T$$
$$\vdots \qquad \vdots$$
$$Din^k = [din_{w-(k-1)n-1}, din_{w-(k-1)n-2}, \ldots, din_0, 0, \ldots, 0]^T,$$

wherein the k number of groups corresponds to input/output of the plurality of divided XOR logics, and
wherein a final output of the plurality of divided XOR logics is expressed as $$Dr(t)=F^n(F^n \ldots (F^n((F^nDin^1(t)) \oplus Din^2(t))) \ldots \oplus Din^k(t)),$$

where the parallel data Din is $Din=[din_{w-1}, din_{w-2}, \ldots din_0]^T$, the CRC code $Cr=[C_{n-1}, C_{n-2}, \ldots C_0]^T$, the CRC code result $CRC_{13}Code$ of n bits is $CRC_{13}Code= [crc_{n-1}, crc_{n-2}, \ldots crc_0]^T$, $w=n \times (k-1)+j$, k is a positive integer, j is a positive integer equal to or less than n, and $$F = \begin{bmatrix} p_{n-1} & 1 & 0 & \cdots & 0 \\ p_{n-2} & 0 & 1 & \cdots & 0 \\ \vdots & \vdots & \vdots & \vdots & 0 \\ p_1 & 0 & 0 & \cdots & 0 \\ p_0 & 0 & 0 & \cdots & 1 \end{bmatrix}.$$

5. The apparatus in accordance with claim 4, wherein a criterion for dividing the data XOR logic to the plurality of divided data XOR logic is expressed as a logic level $L = \rceil \log_2 N \lceil$ for N number of inputs constituting a critical path of the data XOR logic and the CRC code XOR logic, and wherein the logic level calculated for each of the data XOR logic and the CRC code XOR logic is compared to divide the data XOR logic to the plurality of divided data XOR logic when logic level of the data XOR logic is larger than that of the CRC code XOR logic, and where operator $\rceil\ \lceil$ is a round-up to nearest integer operator.

6. The apparatus in accordance with claim 2, wherein a portion Regdc(i) affecting an output of a critical path of the plurality of divided register is expressed as

*Re gdc(i)=wc(i)* if *i=k−1*

*Re gdc(i)=⌈wc(i+1)/wdc(i+1)⌉* otherwise, where operator ⌈ ⌉ is a round-up to nearest integer operator, dc is an output of the critical path of outputs Dr of the data XOR logic, and wc(i) is a number of inputs affecting dc of inputs of the data XOR logic.

* * * * *